United States Patent [19]

Dammeyer et al.

[11] Patent Number: 5,103,226
[45] Date of Patent: Apr. 7, 1992

[54] HEIGHT SENSOR FOR TURRET STOCKPICKER

[75] Inventors: Ned E. Dammeyer, New Bremen; Tim A. Wellman, Coldwater, both of Ohio

[73] Assignee: Crown Equipment Corporation, New Bremen, Ohio

[21] Appl. No.: 446,223

[22] Filed: Dec. 5, 1989

[51] Int. Cl.$^5$ .............................................. H03M 1/22
[52] U.S. Cl. ........................................ 341/14; 341/11
[58] Field of Search ...................... 341/5, 6, 11, 13, 14, 341/116; 414/14, 15, 16

[56] References Cited

U.S. PATENT DOCUMENTS

| | | | |
|---|---|---|---|
| 4,084,083 | 4/1978 | McNally et al. | 341/114 |
| 4,611,269 | 9/1986 | Suzuki et al. | 341/116 |
| 4,626,621 | 12/1986 | Hiyama et al. | 341/116 |
| 4,716,290 | 12/1987 | Ogawa | 341/14 |
| 4,794,251 | 12/1988 | Scholian | 341/9 |

Primary Examiner—William M. Shoop, Jr.
Assistant Examiner—Helen Kim
Attorney, Agent, or Firm—Biebel & French

[57] ABSTRACT

A digital height encoder on a turret stockpicker is used to determine platform height. A pair of fixed reference switches are provided, one to reset a digital height memory to a predetermined height value each time the switch transitions either on or off, the other at a predetermined height near the staging point of telescoping masts for initial calibration of the encoder and for verification of proper operation during normal operations. If the height measurement indicated by the encoder upon the transition of the second or verificaiton switch is not within predetermined limits, an error signal is generated and recalibration will be required. Motion of the platform is also required if the control handle is in the upward direction and the platform has not reached its predetermined upper limits.

2 Claims, 6 Drawing Sheets

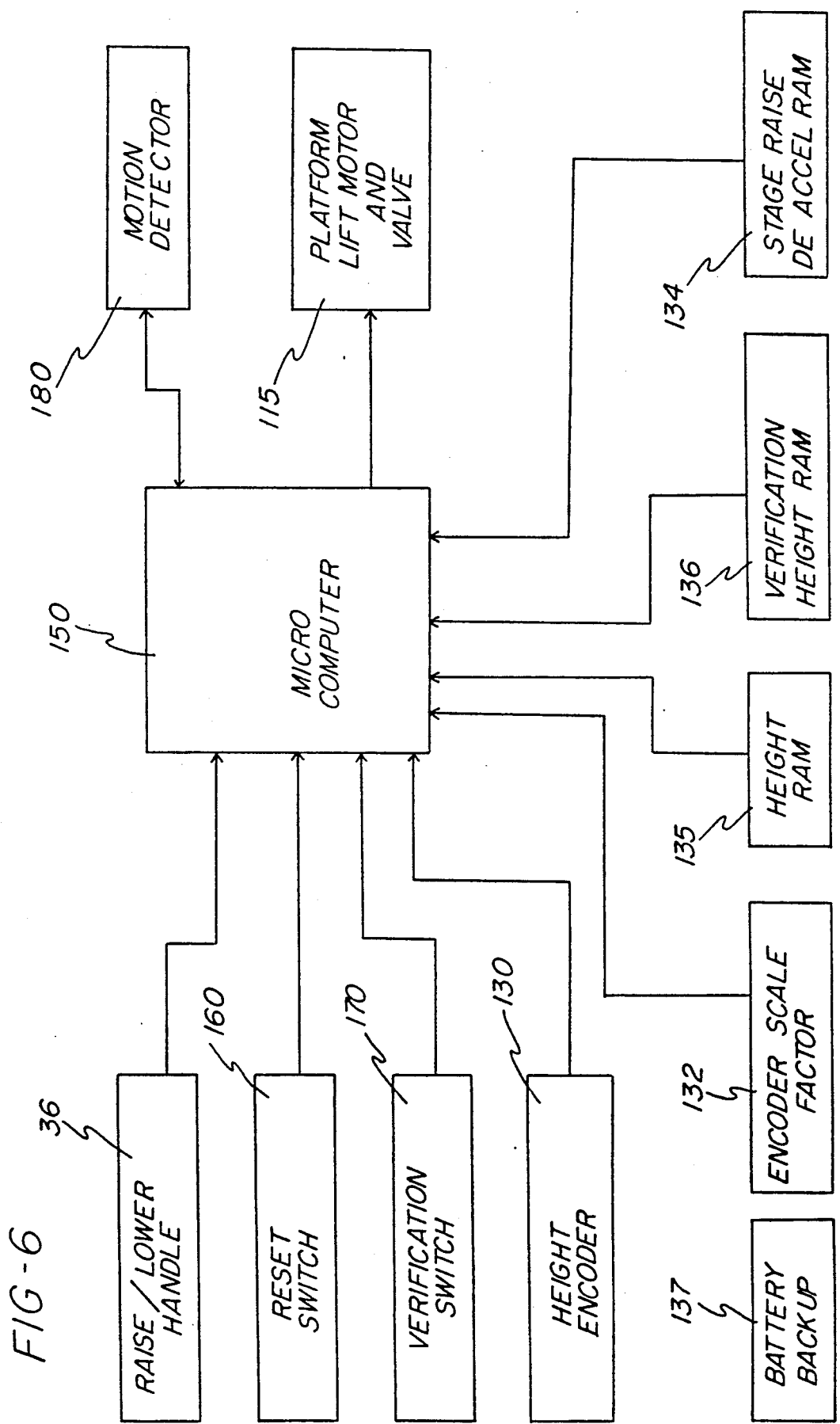

HEIGHT SENSOR FOR TURRET STOCKPICKER

BACKGROUND OF THE INVENTION

This invention relates to an improved apparatus for sensing the height of the platform assembly of a turret stockpicker.

In a materials handling vehicle, such as a turret stockpicker, an operator's platform mounted on a telescoping mast may be raised, along with a load handling assembly supporting load carrying forks, from floor level to the maximum height of the mast. The platform is raised until it reaches the top of the outer section of the mast. At this time, staging occurs, that is, as the platform is raised further, the platform picks up the outer section of the mast which telescopes on the inner or main section until the assembly reaches its maximum height, in the order of 35 feet. Height sensing means are used to control and limit the platform raising operation and other functions of the vehicle.

The height sensor in common use are potentiometers whose shafts are rotated by cables connected between the moveable platform and the base structure. These devices are not completely accurate, however, because of cable stretch, mechanical wear, non-linearity in the potentiometer itself, and drift in the analog-to-digital circuits that convert the potentiometer output to a digital signal useable by a computer or digital controller.

It is important for several reasons that the height sensor to be as accurate as possible since the output of this device controls various functions, such as the speed of the vehicle at various platform heights, the maximum height of the platform, and the speed at which the platform may be lifted.

Digital encoders may provide improved accuracy over analog devices, however digital devices also have their own limitations. For example, unlike potentiometers, digital encoders are not absolute position devices, so if the equipment were turned off when the platform is in other than the fully down position, the height of the platform cannot be ascertained with confidence.

SUMMARY OF THE INVENTION

In the present invention, a digital encoder is used to monitor the height of the platform assembly of a turret stockpicker and switch means associated with the platform assembly are employed to calibrate the encoder and to ensure that the encoder output is within a predetermined tolerance range before certain platform functions are permitted to be performed.

The height encoder is a conventional optical encoder that provides output pulses as the encoder rotates. The encoder itself is connected to a reel mounted on the platform assembly, and the end of the cable from the reel is attached to the base structure or power unit. A reset switch is carried by the platform assembly and is actuated by a cam carried on an outer mast section and is actuated when the platform assembly is approximately 18 inches above its rest or lower limit. A calibration or verification switch is also carried by the platform assembly and is actuated by a second cam mounted on the outer mast section. The distance between switch actuation points is known and is used by the system software to ensure that the vehicle is operated properly.

A digital memory, provided with a separate battery backup, stores the height information, even when the vehicle is powered down. This permits the vehicle to be restarted and to continue to operate normally, but since the encoder is not an absolute device, the switches are used to confirm the accuracy of the stored information as the platform is moved and the switches actuated. If an error is noted, circuit means are provided to require the platform assembly to be lowered and the reset switch actuated.

It is therefore an object of this invention to provide a digital encoder for use with a materials handling vehicle wherein switches actuated upon the platform assembly passing predetermined references are employed to confirm the accuracy of the encoder, and to limit the operation of the platform assembly and the vehicle under certain conditions.

Other objects and advantages of the invention will be apparent from the following description, the accompanying drawings and the appended claims.

BRIEF DESCRIPTION OF THE DRAWINGS

FIG. 6 is a simplified electrical block diagram showing the various electrical components comprising the present invention;

DESCRIPTION OF THE PREFERRED EMBODIMENT

Figure 1:
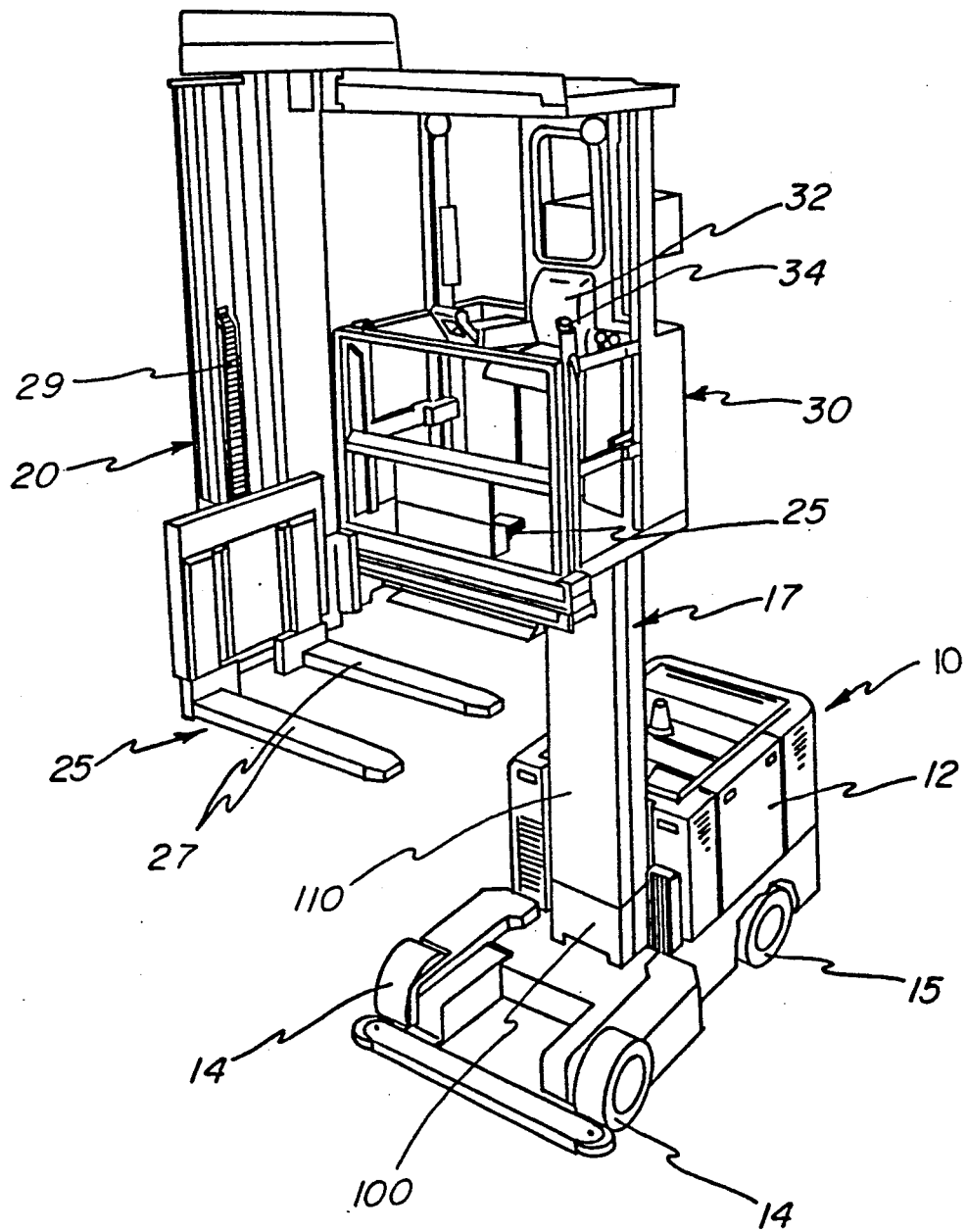
FIG. 1 is a perspective view of a materials handling vehicle, such as a turret stockpicker, employing a digital encoder for indicating platform height.
Figure 2:
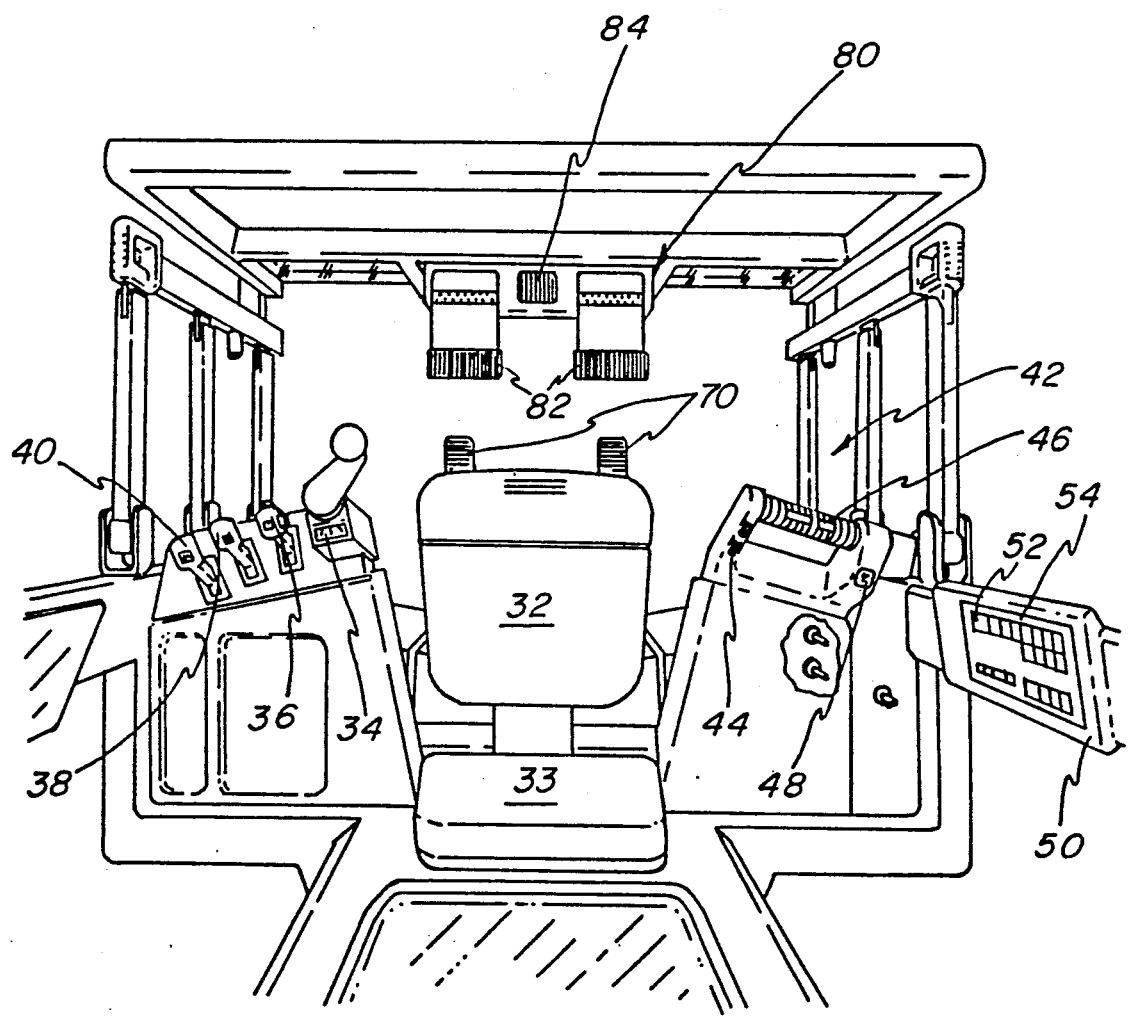
FIG. 2 is a plan view of an operator's platform showing the various controls available to the operator for controlling the vehicle.

Referring now to the drawings, and particularly to FIG. 1 which illustrates a materials handling vehicle, such as a turret stockpicker, the vehicle includes a power unit 10, a load handling assembly 20, and a platform assembly 30.

The power unit 10 includes a power source, such as a battery unit 12, a pair of load wheels 14 positioned under the platform assembly, a pair of steered wheels 15 positioned under the rear end of the power unit 10 with each wheel being driven by a traction motor, a mast 17 on which the platform assembly 30 rides, and a power unit electronic control unit 18.

The load handling assembly 20 includes a fork carriage assembly 25 which may be raised and lowered and also rotated relative to the load handling assembly. A pair of extendable forks 27 are carried by the fork carriage assembly. The fork carriage assembly may be raised from the position shown by means of an auxiliary lift cylinder 29 to place the forks at a convenient height for the operator to place individual packages on the forks, when the vehicle is being used in this mode, or to move the forks upwardly, without moving the platform assembly itself, when lifting pallets of boxes from a rack adjacent the aisle where the vehicle is operating.

The platform assembly 30 includes a seat 32, and back rest 33, from which the operator can operate various controls. A seat switch indicates whether the operator is seated or standing. On the operator's left, the controls include a steering tiller 34, a fork raise and lower control 36, a fork traverse, retract and extend control 38, and a pivot control 40. On the right, the operator is provided with a traction motor control 42, which includes a horn switch 44, an accelerator twist grip and palm switch 46, and a power disconnect switch 48. An indicator control panel 50 to the right of the operator includes various indicator lamps and control switches, such as parking brake switch 54.

The mast 17 includes two sections, a main mast section 100 that is firmly attached to the power unit 10, and a second stage or outer mast section 110 that surrounds and is in telescoping relation with the main mast section. Hydraulic cylinders are provided to raise the platform assembly on rails formed in the outer mast. Power to the hydraulic cylinders is provided by a motor and pump, and flow is controlled by a servo controlled valve, shown generally in FIG. 6 as 115, under control of the raise/lower handle 36. When the platform assembly reaches the top of the outer mast, stops 120 on the platform assembly engage stops 125 on the exterior of the outer mast, causing both the platform assembly and the outer mast to slide upwardly on the main or inner mast section. Details of the construction of the mast and the hydraulic cylinders and associated cables and pulleys may be found in U.S. Pat. No. 4,552,250 assigned to the same assignee as the present invention.

Figure 3:
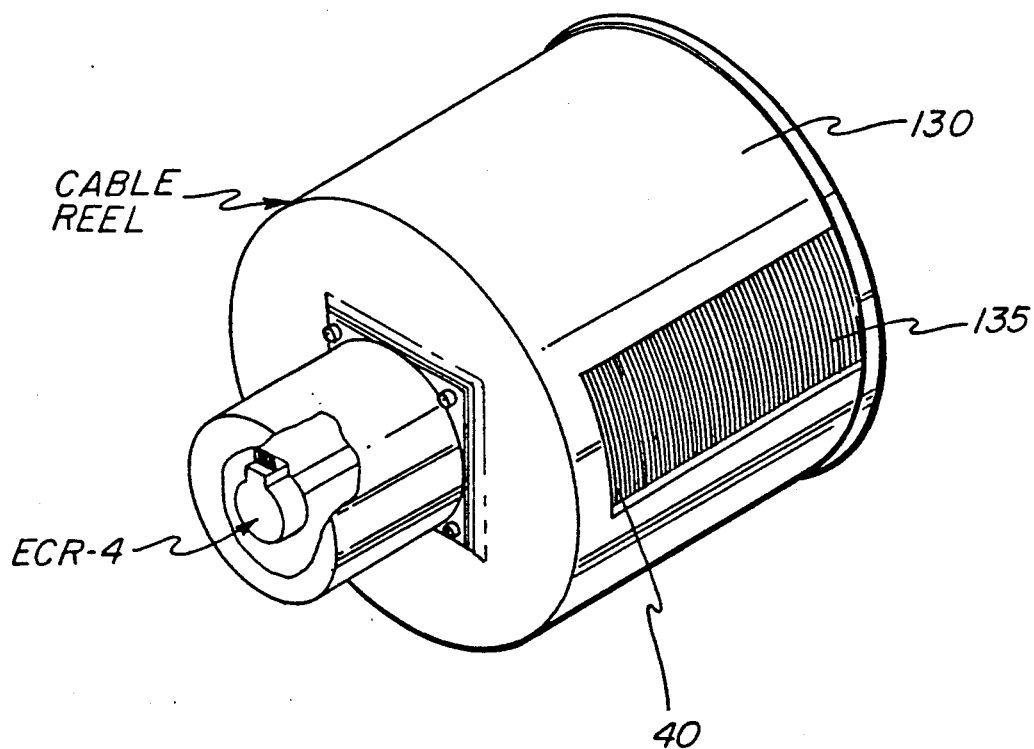
FIG. 3 is a perspective view of the height encoder and associated cable.
Figure 4:
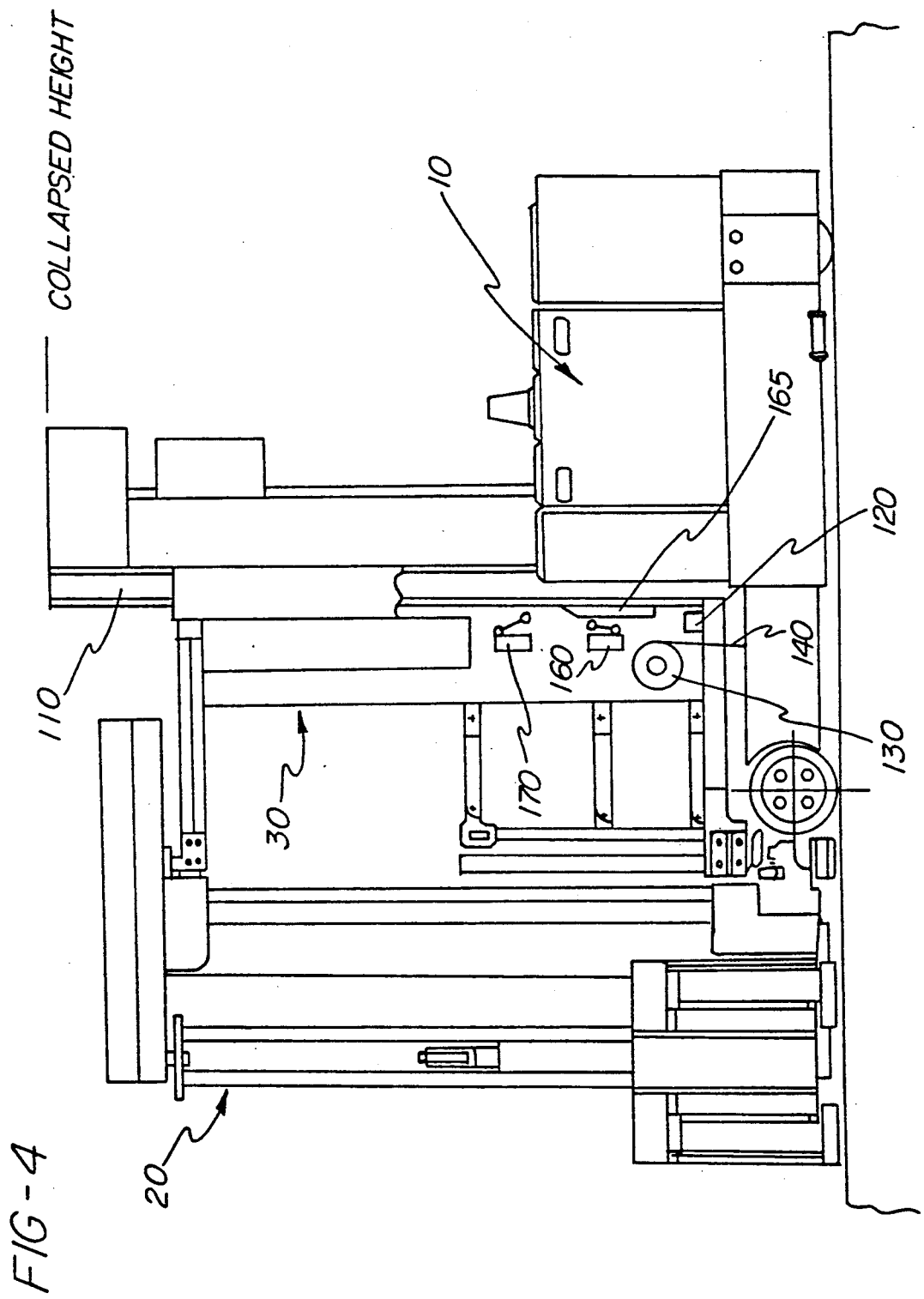
FIG. 4 is a side elevational view of a materials handling vehicle showing the relative locations of the height encoder, reset switch, verification switch on the platform assembly, and the switch actuators on the mast, with the platform assembly being shown in its lowermost position with the reset switch actuated.
Figure 5:
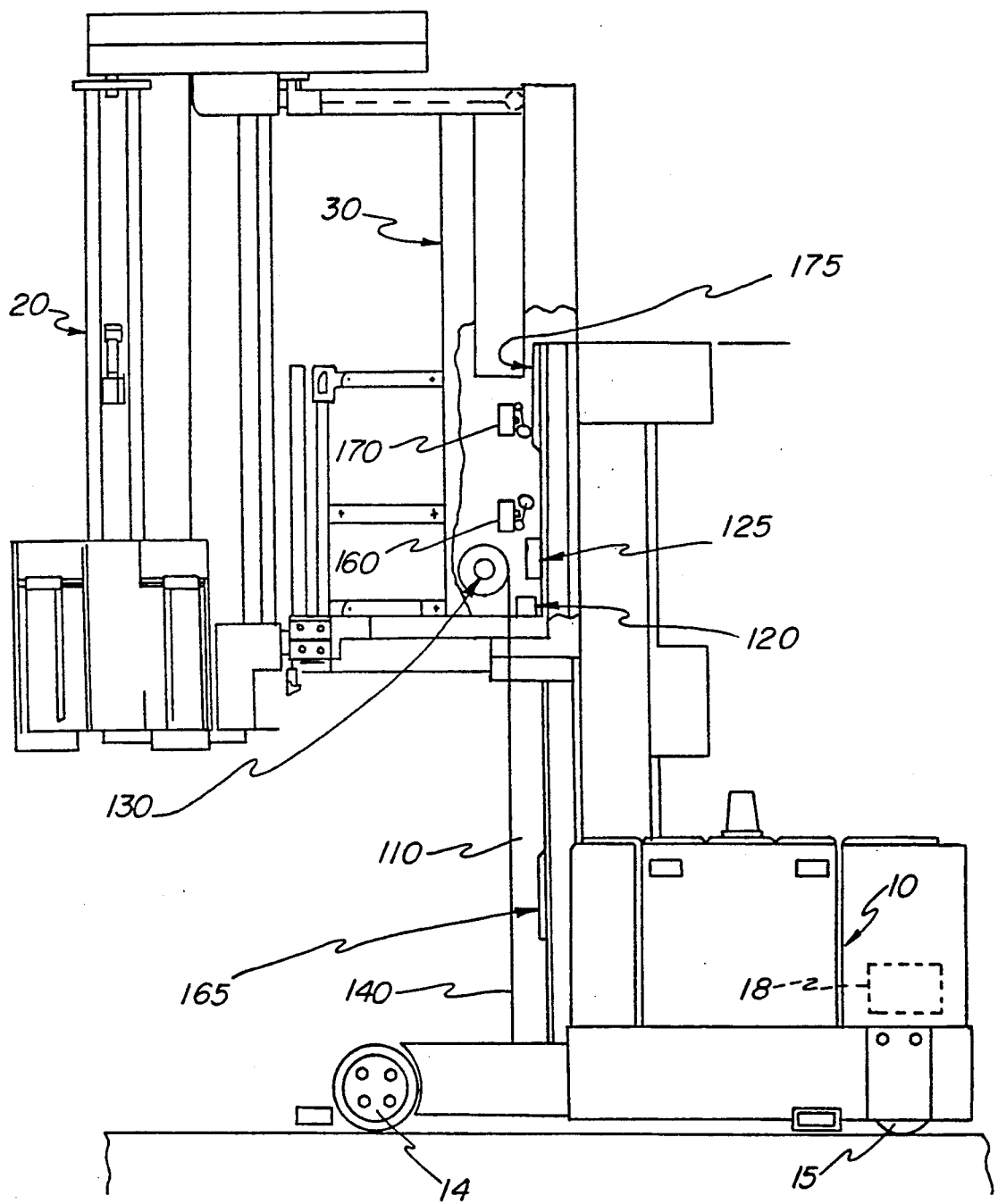
FIG. 5 is a side elevation view similar to FIG. 4 wherein the platform assembly has been raised to actuate the verification switch.

A height encoder 130, FIG. 3, is mounted on the platform assembly, as shown in FIGS. 4 and 5. The height encoder is a conventional optical encoder that is attached to a reel 135 on which is wound a cable 140, with the end of the cable being attached to the power unit 10 and powered by a coil spring. Thus, as the platform assembly 30 moves vertically with respect to the power unit 10, the encoder 130 will sense this movement and provide an output to a micro-computer 150, shown in FIG. 6.

Referring now to FIGS. 4 and 5, the platform assembly 30 is provided with a pair of stops or bumpers 120, one of which is shown. The outer section 110 of mast 17 includes stops 125 (FIG. 5) in vertical alignment with the stops 120 on the platform.

A reset switch 160 is laterally displaced from the stop 120 on the platform and, as shown in FIG. 4, this switch is actuated by a first rail or cam 165. The reset switch 160 will be actuated whenever the platform is within 18 inches of it lowermost or rest position, as shown in FIG. 4. For each transition of the reset switch 160, either on or off, the height RAM 165 will be reset to 18 inches. Thereafter, the height RAM will store the present value of the platform assembly height. This procedure takes care of any accumulated errors that might result from cable stretch or movement of the platform during a power off condition.

A calibration and verification switch 170 is also carried by the platform, at it is actuated by a second rail or cam 175 mounted on an upper portion of the outer mast section 110 (FIG. 5). The verification switch is actuated by the cam 175 when the platform is within approximately 6 inches of staging, that is when the stops 120 on the platform assembly 30 are about to engage the stops 125 on the outer mast section.

Initial calibration of the height sensor involves physically measuring the distance between switches 160 and 170 and comparing the digital output of the encoder between switch actuation events. From this information, an encoder scale factor can be calculated, and this factor is stored in memory 132. Thus, the actual distance is not important, as long as the distance is known. The distance between the actuation of the verification switch and staging is also physically measured. While this distance is not stored directly, another distance is stored in memory 134 which represents the location where deceleration of the platform is desired in order to smooth the transition at staging. Other distance measurements may also be stored in memory 134 for other desired transition control functions, as described in copending application Ser. No. 446,224, filed Dec. 5, 1989.

In operation, the reset switch 160, when actuated, sets the height RAM 135 to the predetermined distance between the lowermost position of the platform assembly and the height where the switch is actuated, or 18 inches in the preferred embodiment. Thus, each time the platform assembly passes this point, and the reset switch 160 transitions from on to off or from off to on, the height RAM 135 is reset to that predetermined distance.

As the platform is raised and the verification switch is actuated, the height measurement in the height RAM 135 is compared with the height determined during calibration, as stored in the verification height RAM 136. If these two distance measurements differ by more than a predetermined tolerance amount, plus or minus 3 inches in the preferred embodiment, then a fault condition will be noted and appropriate action taken.

When the vehicle is powered up, the platform height measurement, previously recorded in a digital memory 135 is supplied to a micro-computer. This memory is provided with a battery backup 137 to maintain the data even when the vehicle power is shut off. For example, if the vehicle were powered down with the platform in an upper position, more than 18 inches up, and thereafter manually lowered for some reason, then the digital memory would indicate that the platform is higher than actual, but this is a fail safe assumption since the speed of the vehicle is limited according to the indicated height. It is not possible for the platform to be raised without powering up the vehicle.

Motion detecting means 180 are provided for confirming that the platform continues to move when the raise/lower handle 36 is beyond a predetermined position; some continuous movement of the platform will occur, except when the platform has reached its upper mechanical limits. If below those limits, and no encoder movement is detected, then further raise operations will be disallowed.

While the method herein described, and the form of apparatus for carrying this method into effect, constitute preferred embodiments of this invention, it is to be understood that the invention is not limited to this precise method and form of apparatus, and that changes may be made in either without departing from the scope of the invention, which is defined in the appended claim.

What is claimed is:

1. A method of measuring the height of a platform assembly of a turret stockpicker comprising the steps of
sensing the position of a first switch placed at a first known height,
sensing the position of a second switch placed at a second known height, rotating a digital encoder in response to the vertical movement of the platform, comparing the output of the digital encoder to the first and second known heights and generating an encoder scale factor, storing the encoder scale factor in a memory, height measurements by reference to the encoder scale factor, storing a fixed value in an encoder height memory each time said first switch is actuated, storing a fixed value representing the height of said second switch in a verification height memory, comparing the absolute encoder generated height measurements with the verification height memory each time said second switch is actuated, generating an error signal if said absolute encoder generated height measurement differs from said verification height by more than a predetermined amount.

2. An apparatus for measuring the height of a platform assembly of a turret stockpicker, said apparatus including control handle means for indicating the direction and speed of platform movement, means responsive to the position of said control handle means for moving the platform assembly, reset switch means positioned at a first predetermined height, height memory means responsive to a transition in said reset switch for recording the first predetermined height measurement, verification switch means positioned at a second predetermined height, verification memory means for storing the height of said second switch means, digital encoder means for indicating the height of the platform assembly and for providing said height memory means with the current height measurement, means for comparing the transition of said verification switch means with said height memory means and for providing an error signal if said height measurements differ by more than a predetermined amount.

* * * * *

UNITED STATES PATENT AND TRADEMARK OFFICE
CERTIFICATE OF CORRECTION

PATENT NO. : 5,103,226
DATED : April 7, 1992
INVENTOR(S) : Ned E. Dammeyer and Tim A. Wellman It is certified that error appears in the above-identified patent and that said Letters Patent is hereby corrected as shown below:

In claim 1, column 5, line 6, after "memory," add

--converting subsequent encoder output into absolute--

Signed and Sealed this

Fifteenth Day of June, 1993

*Attest:*

MICHAEL K. KIRK

*Attesting Officer*     *Acting Commissioner of Patents and Trademarks*